United States Patent
Chang et al.

(10) Patent No.: US 9,903,888 B2
(45) Date of Patent: Feb. 27, 2018

(54) PROBE CARD AND TEST EQUIPMENT WITH THE SAME

(71) Applicant: MPI CORPORATION, Chu-Pei, Hsinchu Shien (TW)

(72) Inventors: Chia-Tai Chang, Chu-Pei (TW); Hsiu-Wei Lin, Chu-Pei (TW); Hung-Yi Lin, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 190 days.

(21) Appl. No.: 14/825,671

(22) Filed: Aug. 13, 2015

(65) Prior Publication Data

US 2016/0047843 A1    Feb. 18, 2016

(30) Foreign Application Priority Data

Aug. 13, 2014    (TW) .............................. 103214403 A

(51) Int. Cl.
| | |
|---|---|
| *G01R 31/00* | (2006.01) |
| *G01R 1/073* | (2006.01) |
| *G01R 1/04* | (2006.01) |
| *G01R 1/067* | (2006.01) |
| *G01R 31/26* | (2014.01) |

(52) U.S. Cl.
CPC ........... *G01R 1/07342* (2013.01); *G01R 1/04* (2013.01); *G01R 1/06733* (2013.01); *G01R 31/2635* (2013.01); *G01R 1/06727* (2013.01); *G01R 1/07307* (2013.01); *G01R 31/2601* (2013.01)

(58) Field of Classification Search
CPC G01R 1/073; G01R 1/07314; G01R 1/07328; G01R 31/2893
See application file for complete search history.

(56) References Cited

U.S. PATENT DOCUMENTS

| | | | | |
|---|---|---|---|---|
| 4,719,417 A | * | 1/1988 | Evans | ..................... G01R 1/073 324/72.5 |
| 6,298,312 B1 | * | 10/2001 | Chen | ..................... G01R 35/00 324/754.11 |
| 7,804,315 B2 | * | 9/2010 | Ni | ..................... G01R 1/07342 324/754.07 |

* cited by examiner

*Primary Examiner* — Tung X Nguyen
(74) *Attorney, Agent, or Firm* — Muncy, Geissler, Olds & Lowe, P.C.

(57) ABSTRACT

A probe card for contacting an LED chip of flip-chip type includes a circuit board, two probes and a fixing seat. The circuit board has a mounting surface and a lateral edge. Each probe has a connecting portion mounted on the circuit board, an extending portion extending from the connecting portion, a cantilever portion connected with the extending portion and protruding out of the lateral edge, and a contacting portion extending from the cantilever portion. The fixing seat is mounted on the mounting surface of the circuit board and has a fixing surface. A part of the extending portion is located between the circuit board and the fixing seat. A test equipment for testing optical characteristics of an LED chip of flip-chip type is provided with the probe card.

19 Claims, 6 Drawing Sheets

PROBE CARD AND TEST EQUIPMENT WITH THE SAME

BACKGROUND OF THE INVENTION

1. Field of the Invention

The present invention relates to a probe card adapted for testing optical characteristics of an LED chip of flip-chip type, and a test equipment with the probe card.

2. Description of the Related Art

It is well known that a prober is a test equipment for testing the performance surface or character parameters of semiconductor chips, such as LED chips or IC chips. As to the task of probing LED chips of flip-chip type, it is usually performed in a way that the electrodes on the surface of the LED chip of flip-chip type are in contact with probes of the test equipment so as to receive testing current from the test equipment and the optical characteristics of the LED chip of flip-chip type are obtained by using a light receiver, such as an integrating sphere. However, with the decreasing of the size of the LED chip of flip-chip type, the accuracy requirement of the test equipment is getting higher and higher.

SUMMARY OF THE INVENTION

The present invention has been accomplished in view of the above-noted circumstances. It is an objective of the present invention to provide a probe card which is adapted for contacting an LED chip of flip-chip type and capable of contacting the electrodes of the LED chip of flip-chip type accurately, thereby improving the testing yield rate and efficiency.

It is another objective of the present invention to provide a test equipment which is adapted for testing optical characteristics of an LED chip of flip-chip type and efficient in fixing the LED chip of flip-chip type without the need of any fixing element to provide extra fixing force on the LED chip of flip-chip type, thereby enabling light to be emitted from five surfaces of the LED chip of flip-chip type, so that the LED chip of flip-chip type can be tested more accurately, thereby improving testing yield rate and efficiency.

To attain the above objectives, the present invention provides a probe card, which is adapted for contacting an LED chip of flip-chip type and comprises a circuit board, two probes, and a fixing seat. The circuit board has a mounting surface and a lateral edge. Each of the probes has a connecting portion mounted on the circuit board, an extending portion extending from the connecting portion, a cantilever portion connected with the extending portion and protruding out of the lateral edge, and a contacting portion extending from the cantilever portion. The fixing seat is mounted on the mounting surface of the circuit board and has a fixing surface. A part of the extending portion is located between the circuit board and the fixing seat.

To attain the above objectives, the present invention provides another probe card which is adapted for contacting an LED chip of flip-chip type and comprises a circuit board and two probe sets. The circuit board has a mounting surface and a lateral edge. Each of the probe sets comprises a first probe and a second probe. The first probe has a first connecting portion mounted on the circuit board, a first extending portion extending from the first connecting portion, a first cantilever portion connected with the first extending portion and protruding out of the lateral edge, and a first contacting portion extending from the first cantilever portion. The second probe has a second connecting portion mounted on the circuit board, a second extending portion extending from the second connecting portion, a second cantilever portion connected with the second extending portion and protruding out of the lateral edge, and a second contacting portion extending from the second cantilever portion. The second contacting portion is more distanced from the lateral edge than the first contacting portion.

To attain the above objectives, the present invention provides a test equipment which is adapted for testing optical characteristics of an LED chip of flip-chip type and comprises a supporting platform, a vacuum source, a light receiver, and a probe card as mentioned above. The supporting platform has a chip section for supporting the LED chip of flip-chip type, and at least one vacuum hole and at least one probe hole, which are located in the chip section. The vacuum source is communicated with the at least one vacuum hole for providing vacuum suction to fix the LED chip of flip-chip type in the chip section. The light receiver is located above the chip section for receiving light emitted from the LED chip of flip-chip type. Each probe of the aforesaid probe card is inserted through associated one of at least one probe hole for contacting an electrode of the LED chip of flip-chip type.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1A:
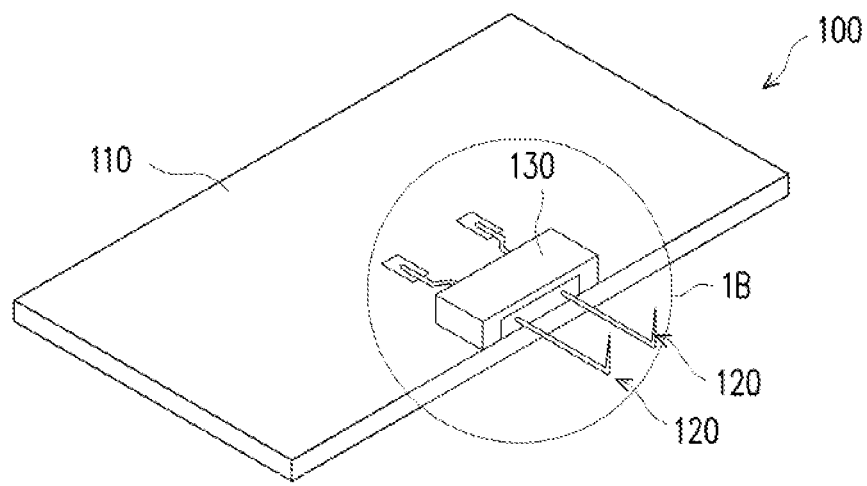
FIG. 1A is a perspective view of a probe card according to an embodiment of the present invention.
Figure 1B:
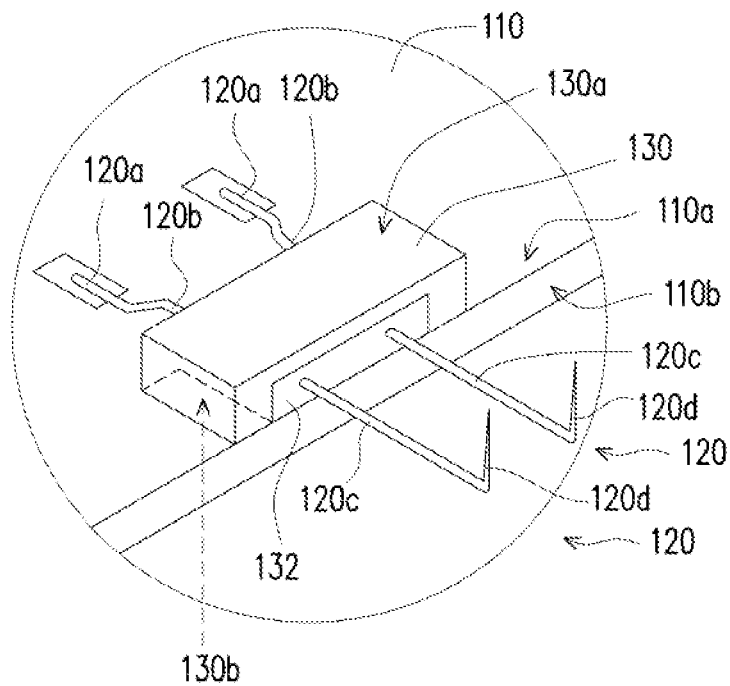
FIG. 1B is an enlarged view of the part 1B of FIG. 1A.
Figure 1C:
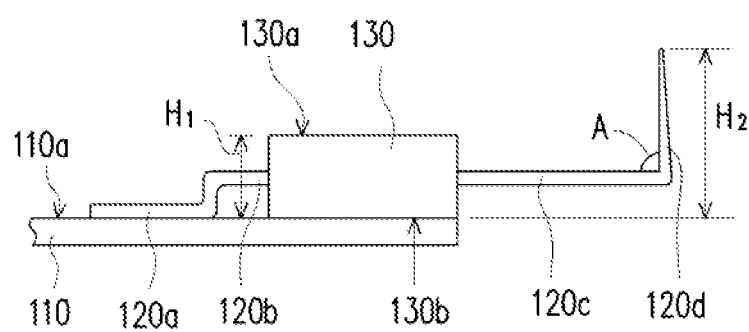
FIG. 1C is an enlarged lateral view of a part of the probe card shown in FIG. 1A.
Figure 1D:
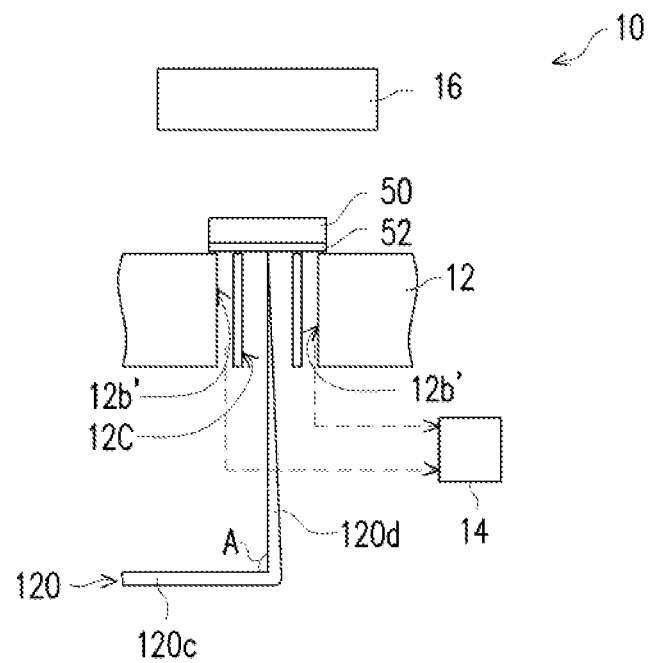
FIG. 1D is a schematic view of a test equipment provided with the probe card shown in FIG. 1A.

Referring to FIGS. 1A, 1B and 1C, a probe card 100 according to an embodiment of the present invention is adapted for contacting an LED chip 50 of flip-chip type as shown in FIG. 1D and providing testing current to the LED chip 50. The probe card 100 comprises a circuit board 110, two probes 120 and a fixing seat 130. The circuit board 110 has a mounting surface 110a and a lateral edge 110b. Each probe 120 has a connecting portion 120a mounted on the circuit board 110, an extending portion 120b extending from the connecting portion 120a, a cantilever portion 120c connected with the extending portion 120b and protruding out of the lateral edge 110b, and a contacting portion 120d extending from the cantilever portion 120c. The fixing seat 130 is mounted on the mounting surface 110a of the circuit board 110 and has a fixing surface 130a. Specifically speaking, the fixing seat 130 has substantially an inverted-U shape having a flat fixing surface 130a and at least one supporting surface 130b opposite to the fixing surface 130a. In this embodiment, the fixing seat 130 has two supporting surfaces 130b which are connected with the mounting surface 110a. In practice, the probes 120 may be fixed to the fixing seat 130 by an adhesive material 132, such as epoxy, in advance; thereafter, the fixing seat 130, which bears the probes 120, is connected to the circuit board 110. It is obvious that the aforesaid way for fixing the probes, the fixing seat and the circuit board together can be modifiedly used depending on practical requirement and is not a limit on the present invention. A part of each extending portion 120b is located between the circuit board 110 and the fixing seat 130, and at least a part of each extending portion 120b is encapsulated by the adhesive material 132. The distance H2 between the terminal of each contacting portion 120d and the mounting surface 110a is longer than the distance H1 between the fixing surface 130a and the mounting surface 110a, as shown in FIG. 1C. In this embodiment, the cantilever portion 120c and the contacting portion 120d of the same probe have an included angle A therebetween, and the included angle A is equal to 90 degrees. It will be appreciated that the degree of the aforesaid included angle A is just an example, not a limit on the present invention. This means the included angle is not limited to 90 degrees, but can be selectively set at a desired angle by the person ordinarily skilled in the art of the present invention.

Figure 1E:
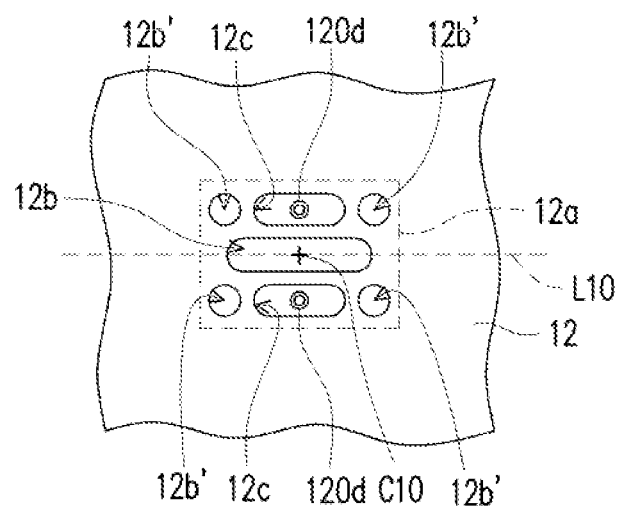
FIG. 1E is a partial top view of a supporting platform shown in FIG. 1D.

Referring to FIGS. 1C, 1D and 1E, the probe card 100 in this embodiment is applicable in a test equipment 10 for testing the optical characteristics of the LED chip 50 of flip-chip type. In addition to the probe card 100, the test equipment 10 further comprises a supporting platform 12, a vacuum source 14 and a light receiver 16 such as an integrating sphere. The supporting platform 12 has a chip section 12a as shown in FIG. 1E, a plurality of vacuum holes 12b and 12b' and two probe holes 12c. The chip section 12a is adapted for supporting the LED chip 50 of flip-chip type. In this embodiment, a vacuum hole 12b with a relatively larger area is located at the center of the chip section 12a; the two probe holes 12c are located at two opposite sides of the vacuum hole 12b. Furthermore, the vacuum holes 12b' are provided in the chip area 12a for enhancing the vacuum suction to fix the LED chip of flip-chip type in the chip section. In this embodiment, the supporting platform may have at least one vacuum hole located at the center of the chip section; in this case, the probe holes may be provided at two opposite sides of the aforesaid at least one vacuum hole. In another embodiment, the supporting platform may have at least one probe hole located at the center of the chip section; in this case, the vacuum holes may be provided around the aforesaid at least one probe hole.

In an embodiment as shown in FIG. 1E, the chip section 12a is defined with at least an imaginary symmetry line L10 passing through a geometric center C10 of the chip section 12a, and the at least one vacuum hole 12b or the at least one probe hole 12c is arranged line symmetrical with respect to the imaginary symmetry line L10. This means, if the chip section 12a is folded in half along the imaginary symmetry line L10, the distribution of the at least one vacuum hole 12b or the at least one probe hole 12c in one of the halves of the chip section is optimal to be similar to that in the other half of the chip section. Taking this embodiment for example, as shown in FIG. 1E, the arrangement of the vacuum holes 12b and 12b' and the probe holes 12c at one side of the imaginary symmetry line L10 is similar to that at the other side of the imaginary symmetry line L10. Because the vacuum holes or the probe holes are arranged symmetrically, the vacuum suction received by the LED chip 50 of flip-chip type will be well-distributed and balanced.

The vacuum source 14 is communicated with the vacuum holes 12b and 12b' for providing vacuum suction to fix the LED chip 50 of flip-chip type in the chip section 12a. The probe holes 12c may be elongated in shape for the corresponding probes 120 to be inserted therethrough. It is to be mentioned that the total area of the vacuum holes 12b and 12b' is larger than the total area of the probe holes 12c, thereby ensuring that the LED chip 50 of flip-chip type will be firmly fixed by the vacuum suction. In this embodiment, the vacuum holes 12b and 12b' and the probe holes 12c are arranged as mentioned above, so that the LED chip 50 of flip-chip type will be firmly fixed by the vacuum suction when being pushed upwards by the two probes 120. Each contacting portion 120d is inserted through the corresponding probe hole 12c and in contact with an electrode 52 of the LED chip 50 of flip-chip type for providing testing current to the LED chip 50 of flip-chip type. The light receiver 16 is located above the chip section 12a for receiving light emitted from the LED chip 50 of flip-chip type.

The probe card in the above-mentioned embodiment is provided with two probes. However, an alternate probe card illustrated in the following embodiment is provided with two probe sets.

Figure 2A:
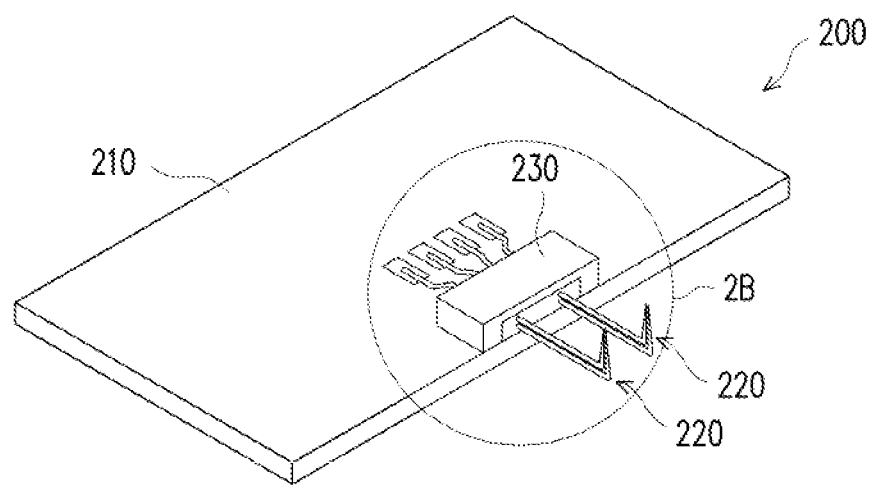
FIG. 2A is a perspective view of a probe card according to another embodiment of the present invention.
Figure 2B:
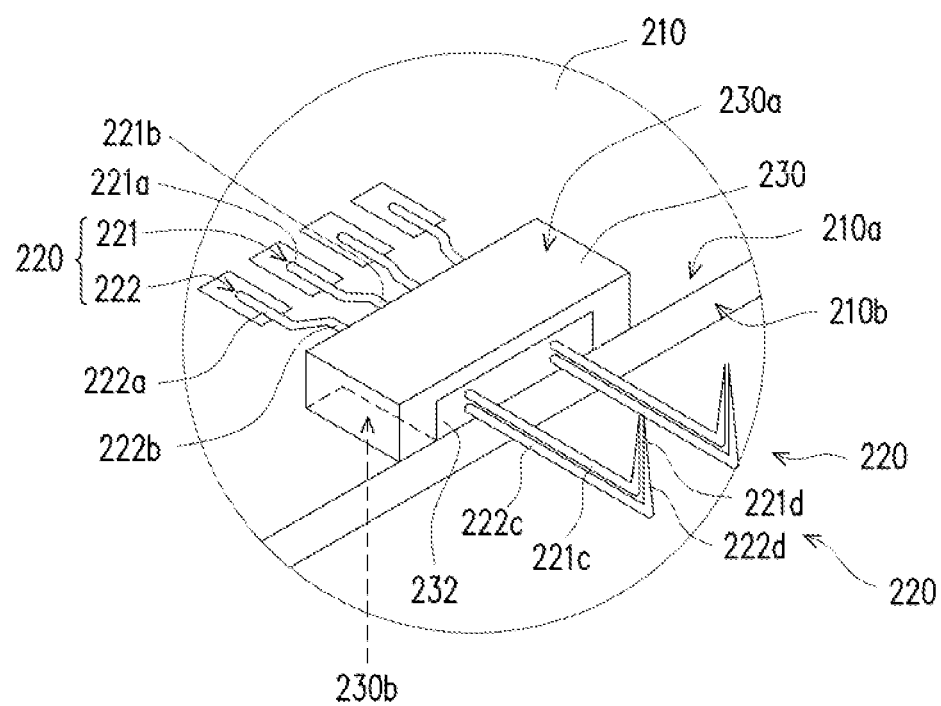
FIG. 2B is an enlarged view of the part 2B of FIG. 2A.
Figure 2C:
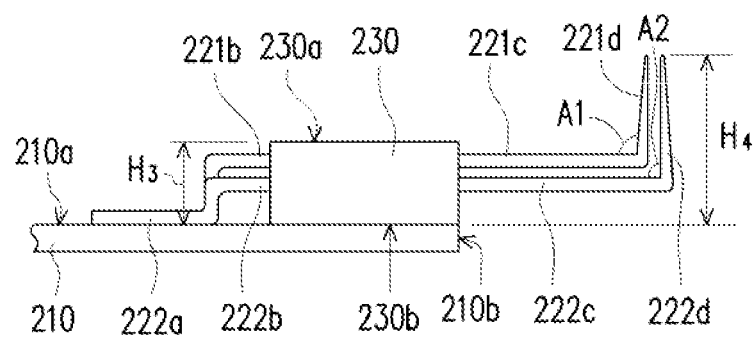
FIG. 2C is an enlarged lateral view of a part of the probe card shown in FIG. 2A.
Figure 2D:
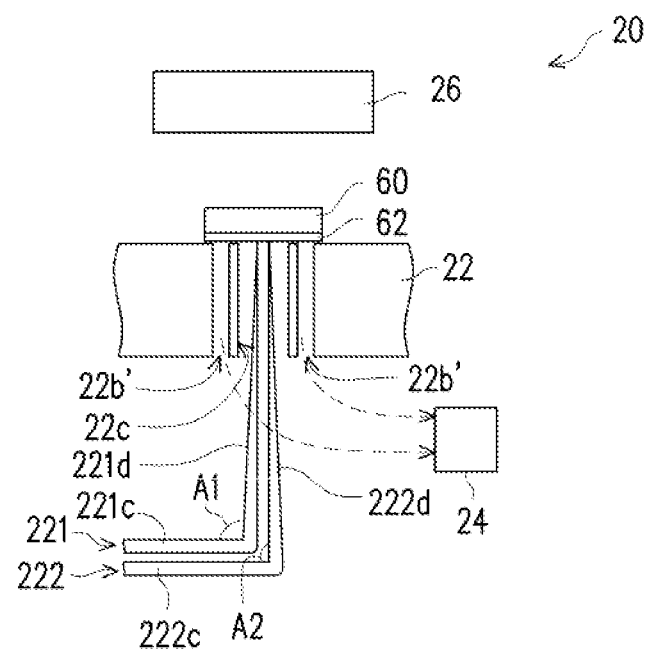
FIG. 2D is a schematic view of a test equipment provided with the probe card shown in FIG. 2A.

Referring to FIGS. 2A, 2B and 2C, a probe card 200 in this embodiment is adapted for contacting an LED chip 60 of flip-chip type as shown in FIG. 2D and providing testing current to the LED chip 60. The probe card 200 comprises a circuit board 210, and two probe sets 220. The circuit board 210 has a mounting surface 210a and a lateral edge 210b. Each probe set 220 comprises a first probe 221 and a second probe 222. The first probe 221 has a first connecting portion 221a mounted on the circuit board 210, a first extending portion 221b extending from the first connecting portion 221a, a first cantilever portion 221c connected with the first extending portion 221b and protruding out of the lateral edge 210b, and a first contacting portion 221d extending from the first cantilever portion 221c. The second probe 222 has a second connecting portion 222a mounted on the circuit board 210, a second extending portion 222b extending from the second connecting portion 222a, a second cantilever portion 222c connected with the second extending portion 222b and protruding out of the lateral edge 210b, and a second contacting portion 222d extending from the second cantilever portion 222c. The second contacting portion 222d is more distanced from the lateral edge 210b than the first contacting portion 221d.

Referring to FIGS. 2A, 2B and 2C, the probe card 200 further comprises a fixing seat 230 which is mounted on the mounting surface 210a of the circuit board 210 and has a fixing surface 230a. Specifically speaking, the fixing seat 230 has substantially an inverted-U shape having a flat fixing surface 230a and at least one supporting surface 230b opposite to the fixing surface 230a. In this embodiment, the fixing seat 230 has two supporting surfaces 230b which are connected with the mounting surface 210a. In practice, the probe sets 220 may be fixed to the fixing seat 230 by an adhesive material 232, such as epoxy, in advance; thereafter, the fixing seat 230, which bears the probe sets 220, is connected to the circuit board 210. It is obvious that the aforesaid way for fixing the probe sets, the fixing seat and the circuit board together can be modifiedly used depending on practical requirement and is not a limit on the present invention. A part of each first extending portion 221b and a part of each second extending portion 222b are located between the circuit board 210 and the fixing seat 230, and at least a part of each first extending portion 221b and at least a part of each second extending portion 222b are encapsulated by the adhesive material 232. The distance H4 between the terminal of each first contacting portion 221d and the mounting surface 210a and the distance H4 between the terminal of each second contacting portion 222d and the mounting surface 210a are both longer than the distance H3 between the fixing surface 230a and the mounting surface 210a.

In this embodiment as shown in FIGS. 2A, 2B and 2C, the first cantilever portion 221c, the first contacting portion 221d, the second cantilever portion 222c and the second contacting portion 222d of the same probe set may be located on an imaginary plane. Besides, in the same probe set of this embodiment, a first included angle A1 between the first cantilever portion 221c and the first contacting portion 221d is larger than 90 degrees, and a second included angle A2 between the second cantilever portion 222c and the second contacting portion 222d is smaller than 90 degrees. In the same probe set of another embodiment, the first included angle A1 between the first cantilever portion 221c and the first contacting portion 221d is equal to 90 degrees, and the second included angle A2 between the second cantilever portion 222c and the second contacting portion 222d is smaller than 90 degrees. In the same probe set of still another embodiment, the first included angle A1 between the first cantilever portion 221c and the first contacting portion 221d is larger than 90 degrees, and the second included angle A2 between the second cantilever portion 222c and the second contacting portion 222d is equal to 90 degrees. Resulted from the aforesaid arrangement of the included angel between the cantilever portion and the contacting portion of each probe, the probe sets 220 of the probe card of the present invention are capable of contacting the electrodes 62 of the LED chip 60 of flip-chip type accurately.

Figure 2E:
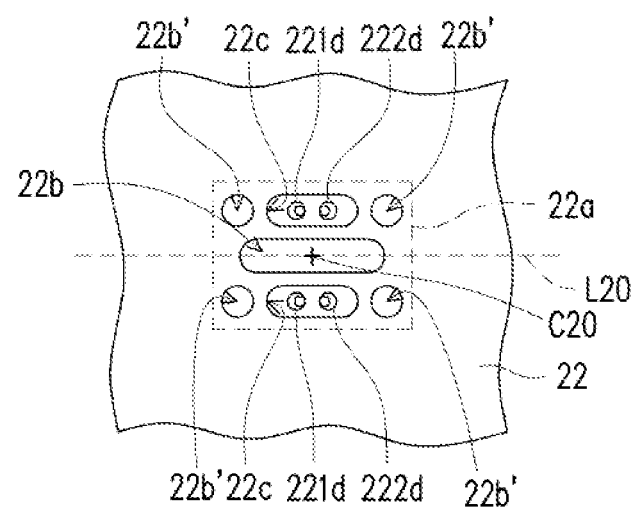
FIG. 2E is a partial top view of a supporting platform shown in FIG. 2D.

Referring to FIGS. 2C, 2D and 2E, the probe card 200 in this embodiment is applicable in a test equipment 20 for testing the optical characteristics of the LED chip 60 of flip-chip type. In addition to the probe card 200, the test equipment 20 further comprises a supporting platform 22, a vacuum source 24 and a light receiver 26. The supporting platform 22 has a chip section 22a as shown in FIG. 2E, a plurality of vacuum holes 22b and 22b' and two probe holes 22c. The chip section 22a is adapted for supporting the LED chip 60 of flip-chip type. The vacuum holes 22b and 22b' and the probe holes 22c are located in the chip section 22a and are arranged line symmetrical with respect to an imaginary symmetry line L20 that passes through a geometric center C20 of the chip section 22a. Furthermore, each probe hole 22c may be elongated in shape for the corresponding probe set 220 to be inserted therethrough. The first contacting portion 221d and the second contacting portion 222d of each probe set 220 are inserted through the corresponding probe hole 22c and in contact with an electrode 62 of the LED chip 60 of flip-chip type for providing testing current to the LED chip 60 of flip-chip type. The technical features of the supporting platform 22, the vacuum source 24 and the light receiver 26 of this embodiment are the same with the technical features of the supporting platform 12, the vacuum source 14 and the light receiver 16 of the aforesaid embodiment, thereby not specified here.

In summary, the probe card of the present invention is adapted for contacting the LED chip of flip-chip type and providing testing current to the LED chip by two probes or probe sets. Resulted from the arrangement of the included angle between the cantilever portion and the contacting portion of the same probe, the probes of the probe card of the present invention are capable of contacting the electrodes of the LED chip of flip-chip type accurately, thereby improving the testing yield rate and efficiency. Besides, the probes used in the probe card of the present invention are relatively thinner in dimension, so the force upwardly exerting on the LED chip of flip-chip type from the probes will be smaller than the vacuum suction for fixing the LED chip of flip-chip type from the vacuum source. Therefore, when the probe card of the present invention and the test equipment with the same are employed, the vacuum suction is efficient in fixing the LED chip of flip-chip type without the need of any fixing element, such as elements for pressing the LED chip or fixing the side edge of the LED chip, to provide extra fixing force on the LED chip of flip-chip type. In this way, light can be emitted from five surfaces of the LED chip of flip-chip type, so that the LED chip of flip-chip type can be tested more accurately, thereby improving testing yield rate and efficiency. Last but not least, because the probes used in the probe card of the present invention are relatively thinner in dimension, the area of the probe holes could be configured relatively smaller. Therefore, the supporting platform can be provided with a relatively greater number of vacuum holes in such a way that the total area of the vacuum holes is larger than the total area of the probe holes, thereby further improving the vacuum suction to fix the LED chip of flip-chip type.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probe card for contacting an LED chip of flip-chip type, the probe card comprising:

a circuit board having a mounting surface and a lateral edge;

two probes, each of the probes having a connecting portion mounted on the circuit board, an extending portion extending from the connecting portion, a cantilever portion connected with the extending portion and protruding out of the lateral edge, and a contacting portion extending from the cantilever portion; and a fixing seat mounted on the mounting surface of the circuit board and provided with a fixing surface;

wherein a part of the extending portion of each of the probes is located between the circuit board and the fixing seat, wherein the fixing seat has substantially an inverted-U shape having two supporting surfaces opposite to the fixing surface and connected with the mounting surface, and a space in which an adhesive material is filled, and wherein at least a part of the extending portion is encapsulated by the adhesive material.

2. The probe card as claimed in claim 1, wherein a distance between a terminal of the contacting portion of each of the probes and the mounting surface is longer than a distance between the fixing surface and the mounting surface.

3. The probe card as claimed in claim 1, wherein the cantilever portion and the contacting portion of each of the probes have an included angle therebetween.

4. A probe card for contacting an LED chip of flip-chip type, the probe card comprising:

a circuit board having a mounting surface and a lateral edge; and two probe sets, each of the probe sets comprising:

a first probe having a first connecting portion mounted on the circuit board, a first extending portion extending from the first connecting portion, a first cantilever portion connected with the first extending portion and protruding out of the lateral edge, and a first contacting portion extending from the first cantilever portion; and a second probe having a second connecting portion mounted on the circuit board, a second extending portion extending from the second connecting portion, a second cantilever portion connected with the second extending portion and protruding out of the lateral edge, and a second contacting portion extending from the second cantilever portion and more distanced from the lateral edge than the first contacting portion, wherein the first cantilever portion, the first contacting portion, the second cantilever portion and the second contacting portion of each said probe set are located on an imaginary plane, and wherein in one said probe set, the first cantilever portion of the first probe is located above the second cantilever portion of the second probe, and a terminal of the first contacting portion of the first probe is flush with a terminal of the second contacting portion of the second probe.

5. The probe card as claimed in claim 4, further comprising:

a fixing seat mounted on the mounting surface of the circuit board and provided with a fixing surface;

wherein a part of the first extending portion of each said first probe and a part of the second extending portion of each said second probe are located between the circuit board and the fixing seat.

6. The probe card as claimed in claim 5, wherein the fixing seat has substantially an inverted-U shape having at least one supporting surface opposite to the fixing surface and connected with the mounting surface.

7. The probe card as claimed in claim 5, wherein a distance between the terminal of the first contacting portion of each said first probe and the mounting surface and a distance between the terminal of the second contacting portion of each said second probe and the mounting surface are both longer than a distance between the fixing surface and the mounting surface.

8. The probe card as claimed in claim 5, wherein in one said probe set, a first included angle between the first cantilever portion and the first contacting portion is larger than 90 degrees, and a second included angle between the second cantilever portion and the second contacting portion is smaller than 90 degrees or equal to 90 degrees.

9. The probe card as claimed in claim 5, wherein in one said probe set, a first included angle between the first cantilever portion and the first contacting portion is equal to 90 degrees, and a second included angle between the second cantilever portion and the second contacting portion is smaller than 90 degrees.

10. A test equipment for testing optical characteristics of an LED chip of flip-chip type, the test equipment comprising:

a supporting platform having a chip section for supporting the LED chip of flip-chip type, and at least one vacuum hole and at least one probe hole, which are located in the chip section;

a vacuum source communicated with said at least one vacuum hole for providing vacuum suction to fix the LED chip of flip-chip type in the chip section;

a light receiver located above the chip section for receiving light emitted from the LED chip of flip-chip type; and a probe card as claimed in claim 1, wherein each of the probes is inserted through one of said at least one probe hole for contacting an electrode of the LED chip of flip-chip type.

11. The test equipment as claimed in claim 10, wherein said at least one vacuum hole or said at least one probe hole is located at a center of the chip section.

12. The test equipment as claimed in claim 10, wherein a total area of said at least one vacuum hole is larger than a total area of said at least one probe hole.

13. The test equipment as claimed in claim 10, wherein said at least one probe hole has an elongated shape for the probes to be inserted therethrough.

14. The test equipment as claimed in claim 10, wherein the chip section is defined with a geometric center and at least one imaginary symmetry line passing through the geometric center; said at least one vacuum hole or said at least one probe hole is arranged line symmetrical with respect to the at least one imaginary symmetry line.

15. A test equipment for testing optical characteristics of an LED chip of flip-chip type, the test equipment comprising:

a supporting platform having a chip section for supporting the LED chip of flip-chip type, and at least one vacuum hole and at least one probe hole, which are located in the chip section;

a vacuum source communicated with said at least one vacuum hole for providing vacuum suction to fix the LED chip of flip-chip type in the chip section;

a light receiver located above the chip section for receiving light emitted from the LED chip of flip-chip type; and a probe card as claimed in claim 4, wherein each of the first and second probes is inserted through one of said at least one probe hole for contacting an electrode of the LED chip of flip-chip type.

16. The test equipment as claimed in claim 15, wherein said at least one vacuum hole or said at least one probe hole is located at a center of the chip section.

17. The test equipment as claimed in claim 15, wherein a total area of said at least one vacuum hole is larger than a total area of said at least one probe hole.

18. The test equipment as claimed in claim 15, wherein said at least one probe hole has an elongated shape for the probes to be inserted therethrough.

19. The test equipment as claimed in claim 15, wherein the chip section is defined with a geometric center and at least one imaginary symmetry line passing through the geometric center; said at least one vacuum hole or said at least one probe hole is arranged line symmetrical with respect to the at least one imaginary symmetry line.

* * * * *